(12) United States Patent
Wang et al.

(10) Patent No.: US 11,251,172 B2
(45) Date of Patent: Feb. 15, 2022

(54) DISPLAY PANEL WITH SENSORS AND MANUFACTURING METHOD THEREOF, AND DISPLAY DEVICE WITH SENSORS

(71) Applicant: BOE TECHNOLOGY GROUP CO., LTD., Beijing (CN)

(72) Inventors: Haisheng Wang, Beijing (CN); Xue Dong, Beijing (CN); Xiaoliang Ding, Beijing (CN); Yingming Liu, Beijing (CN); Lei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 70 days.

(21) Appl. No.: 16/630,417

(22) PCT Filed: Jul. 15, 2019

(86) PCT No.: PCT/CN2019/097656
§ 371 (c)(1),
(2) Date: Jan. 10, 2020

(87) PCT Pub. No.: WO2020/082835
PCT Pub. Date: Apr. 30, 2020

(65) Prior Publication Data
US 2021/0020622 A1  Jan. 21, 2021

(30) Foreign Application Priority Data

Oct. 25, 2018  (CN) .......................... 201811251546.9

(51) Int. Cl.
*H01L 33/00* (2010.01)
*H01L 25/18* (2006.01)
(Continued)

(52) U.S. Cl.
CPC .......... *H01L 25/18* (2013.01); *H01L 51/5228* (2013.01); *H01L 51/5234* (2013.01);
(Continued)

(58) Field of Classification Search
CPC ............. H01L 51/5228; H01L 51/5234; H01L 27/3246; H01L 27/3283
See application file for complete search history.

(56) References Cited

U.S. PATENT DOCUMENTS

2004/0262614 A1   12/2004   Hack et al.
2007/0188085 A1    8/2007   Young
(Continued)

FOREIGN PATENT DOCUMENTS

CN      1934708 A     3/2007
CN    101964353 A     2/2011
(Continued)

*Primary Examiner* — Phuc T Dang
(74) *Attorney, Agent, or Firm* — The Webb Law Firm (57) ABSTRACT

The disclosure provides a display panel and a manufacturing method thereof, and a display device. The display panel includes a substrate; an array of pixel units disposed on a first side of the substrate, wherein each of at least some of the pixel units comprises: a light emitting layer, an anode layer and a primary cathode layer which is light transmissive disposed on two sides of the light emitting layer, the anode layer being closer to the substrate than the primary cathode layer; an array of sensors disposed on one side of the array of pixel units, which is far away from the substrate, and each sensor senses the light emitted from a corresponding pixel unit.

17 Claims, 6 Drawing Sheets

(51) Int. Cl.
*H01L 51/52* (2006.01)
*H01L 27/32* (2006.01)
(52) U.S. Cl.
CPC ........ *H01L 27/322* (2013.01); *H01L 27/3246* (2013.01); *H01L 27/3283* (2013.01); *H01L 2251/308* (2013.01)

(56) References Cited

U.S. PATENT DOCUMENTS

| | | |
|---|---|---|
| 2010/0084642 A1 | 4/2010 | Hanari |
| 2012/0138960 A1 | 6/2012 | Kim et al. |
| 2014/0183342 A1 | 7/2014 | Shedletsky et al. |
| 2017/0346037 A1* | 11/2017 | Huang ................ H01L 51/5024 |
| 2018/0005007 A1* | 1/2018 | Du ....................... G06K 9/2036 |
| 2018/0188873 A1* | 7/2018 | Cheng ............... G02F 1/136286 |
| 2019/0067402 A1 | 2/2019 | Cho |
| 2020/0083205 A1 | 3/2020 | Ding et al. |

FOREIGN PATENT DOCUMENTS

| | | |
|---|---|---|
| CN | 204361100 U | 5/2015 |
| CN | 104916658 A | 9/2015 |
| CN | 107611159 A | 1/2018 |
| CN | 107845666 A | 3/2018 |
| CN | 108922918 A | 11/2018 |

* cited by examiner

DISPLAY PANEL WITH SENSORS AND MANUFACTURING METHOD THEREOF, AND DISPLAY DEVICE WITH SENSORS

CROSS-REFERENCE TO RELATED APPLICATIONS

The present application is a U.S. National Stage Application under 35 U.S.C. § 371 of International Patent Application No. PCT/CN2019/097656, filed on Jul. 25, 2019 which claims priority of China Patent Application No. 201811251546.9 filed on Oct. 25, 2018, the disclosure of both of which are incorporated by reference hereby in entirety into the present application.

TECHNICAL FIELD

The present disclosure relates to the field of display technologies, and in particular, to a display panel and a manufacturing method thereof, and a display device.

BACKGROUND

In order to mitigate the problem of uneven brightness of an OLED (Organic Light Emitting Diode) panel, luminance intensity of pixels of the OLED panel needs to be detected in real time so as to compensate for the luminous brightness of the pixels according to the result of detection. A sensor is usually provided on a light-emitting side of the OLED panel to detect the luminous brightness of the OLED panel.

SUMMARY

According to a first aspect of embodiments of the present disclosure, there is provided a display panel comprising: a substrate; an array of pixel units disposed on a first side of the substrate, wherein each of at least some of the pixel units comprises: a light emitting layer, an anode layer and a primary cathode layer which is light transmissive disposed on two sides of the light emitting layer, the anode layer being closer to the substrate than the primary cathode layer; an array of sensors disposed on one side of the array of pixel units, which is far away from the substrate, each sensor sensing the light emitted from a corresponding pixel unit.

In some embodiments, the display panel comprises a pixel defining layer for defining the array of pixel units; each of the at least some of the pixel units further comprises an auxiliary cathode and a connector, the connector is disposed in the pixel defining layer to electrically connect the auxiliary cathode with the primary cathode layer, the auxiliary cathode being closer to the substrate than the primary cathode layer.

In some embodiments, the auxiliary cathode is a conductive mesh.

In some embodiments, the primary cathode layer comprises a first cathode layer and a second cathode layer, a thickness of the first cathode layer is greater than a thickness of the second cathode layer.

In some embodiments, the material of the first cathode layer is indium zinc oxide; the material of the second cathode layer is magnesium-silver alloy.

In some embodiments, the thickness of the first cathode layer is not less than 2000 angstroms; the thickness of the second cathode layer is 300 to 500 angstroms.

In some embodiments, the display panel further comprises a packaging layer disposed on one side of the primary cathode layer, which is far away from the light emitting layer.

In some embodiments, the display panel further comprises: a color filter layer disposed on a second side of the substrate which is far away from the array of pixel units.

In some embodiments, a projection of the sensor on the substrate covers a projection of a corresponding pixel unit on the substrate. In some embodiments, the sensors in the array of sensors correspond to the pixel units in the array of pixel units one to one.

According to a second aspect of the embodiments of the present disclosure, there is provided a display device comprising: a substrate; an array of pixel units disposed on a first side of the substrate, wherein each of at least some of the pixel units comprises: a light emitting layer, an anode layer and a primary cathode layer which is light transmissive disposed on two sides of the light emitting layer, the anode layer being closer to the substrate than the primary cathode layer; an array of sensors disposed on one side of the array of pixel units, which is far away from the substrate, each sensor sensing the light emitted from a corresponding pixel unit.

According to a third aspect of the embodiments of the present disclosure, there is provided a method of manufacturing a display panel, comprising: providing a substrate; forming an array of pixel units on a first side of a substrate, wherein each of at least some of the pixel units comprises: a light emitting layer, an anode layer and a primary cathode layer which is light transmissive disposed on two sides of the light emitting layer, the anode layer being closer to the substrate than the primary cathode layer; and forming an array of sensors on one side of the array of pixel units which is far away from the substrate, wherein each sensor senses light emitted from a corresponding pixel unit.

In some embodiments, each of the at least some of the pixel units further comprises an auxiliary cathode and a connector, the connector is disposed in a pixel defining layer defining the array of pixel units to electrically connect the auxiliary cathode with the primary cathode layer, the auxiliary cathode being closer to the substrate than the primary cathode layer.

In some embodiments, forming each of the at least some of the pixel units comprises: forming an anode layer and an auxiliary cathode on the first side of the substrate; forming a pixel defining layer on the first side of the substrate, the pixel defining layer being provided with a first opening exposing at least a portion of the anode layer and a second opening exposing at least a portion of the auxiliary cathode; forming a light emitting layer in the first opening and the second opening; forming a primary cathode layer on one side of the light emitting layer far away from the anode layer; perforating the primary cathode layer to form a connector between the primary cathode layer and the auxiliary cathodes, thereby electrically connecting the primary cathode layer and the auxiliary cathodes.

In some embodiments, the primary cathode layer comprises a first cathode layer and a second cathode layer, a thickness of the first cathode layer is greater than a thickness of the second cathode layer.

In some embodiments, the material of the first cathode layer is indium zinc oxide; the material of the second cathode layer is magnesium-silver alloy.

In some embodiments, the thickness of the first cathode layer is not less than 2000 angstroms; the thickness of the second cathode layer is 300 to 500 angstroms.

In some embodiments, further comprises: forming an encapsulation layer on one side of the primary cathode layer far away from the light emitting layer.

In some embodiments, further comprises: forming a color filter layer on the second side of the substrate, wherein the second side of the substrate is far away from the array of pixel units.

Other features of the present disclosure and advantages thereof will become clear from the following detailed description of exemplary embodiments thereof, which proceeds with reference to the accompanying drawings.

BRIEF DESCRIPTION OF THE DRAWINGS

The accompanying drawings, which constitute a part of this specification, illustrate embodiments of the disclosure and together with the description, serve to explain the principles of the disclosure.

The present disclosure may be more clearly understood from the following detailed description with reference to the accompanying drawings, in which.

It should be understood that the dimensions of the various parts shown in the figures are not drawn to scale. Further, the same or similar reference numerals denote the same or similar components.

DETAILED DESCRIPTION

Various exemplary embodiments of the present disclosure will now be described in detail with reference to the accompanying drawings. The description of the exemplary embodiments is merely illustrative and is in no way intended to limit the disclosure, its application, or uses. The present disclosure may be embodied in many different forms and is not limited to the embodiments described herein. These embodiments are provided so that this disclosure will be thorough and complete, and will fully convey the scope of the disclosure to those skilled in the art. It should be noted that: the relative arrangement of parts and steps, the composition of materials and values set forth in these embodiments are to be construed as illustrative only and not as limiting unless otherwise specifically stated.

The use of "first", "second", and similar terms in this disclosure is not intended to indicate any order, quantity, or importance, but rather are used to distinguish one element from another. The word "comprising" or "comprises" and the like, means that the element preceding the word contains the elements listed after the word, without excluding the possibility that other elements are also contained.

All terms (including technical or scientific terms) used herein have the same meaning as commonly understood by one of ordinary skill in the art to which this disclosure belongs unless specifically defined otherwise. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Techniques, methods, and apparatus known to those of ordinary skill in the relevant art may not be discussed in detail but are intended to be part of the specification where appropriate.

The inventors found through research that the sensor is disposed on the light emitting side of the OLED panel, influencing the display of the OLED panel. In the pixel units of the OLED panel, a primary cathode layer is typically made of aluminum. Since light cannot penetrate the primary cathode layer, the sensor cannot be placed on the non-light-emitting side of the OLED panel.

Accordingly, the present disclosure proposes a solution in which light can pass through a cathode of the pixel unit, so that the sensor can be placed on the non-light-emitting side of the OLED panel.

Figure 1:
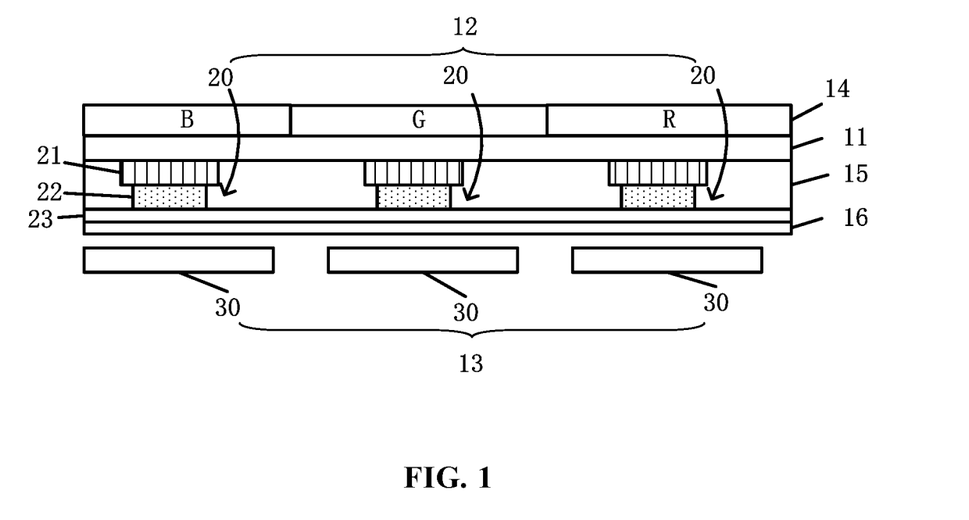
FIG. 1 is a schematic structural diagram of a display panel according to one embodiment of the present disclosure.

FIG. 1 is a schematic structural diagram of a display panel according to one embodiment of the present disclosure. As shown in FIG. 1, the display panel includes a substrate 11, an array of pixel units 12, and an array of sensors 13.

The array of pixel units 12 is disposed on a first side of the substrate 11. In the array of pixel units 12, each of at least some of the pixel units 20 includes: an anode layer 21, a light emitting layer 22 and a primary cathode layer 23. The anode layer 21 and the primary cathode layer 23 are disposed on two sides of the light emitting layer 22. The anode layer 21 is closer to the substrate 11 than the primary cathode layer 23. The primary cathode layer 23 is light transmissive. In some embodiments, the primary cathode layers 23 of all pixel units 20 are connected.

In some embodiments, the material of the primary cathode layer 23 is a magnesium-silver alloy, or other electrically conductive material that is light transmissive.

In some embodiments, a thickness of the primary cathode layer 23 is 300 to 500 angstroms. For example, in the case where the thickness of the primary cathode layer 23 is 500 angstroms, a light transmittance of the primary cathode layer 23 may reach 80%.

The array of sensors 13 is disposed on a side of the array of pixel units 12 away from the substrate 11. The sensors 30 in the array of sensors 13 correspond to the pixel units 20 in the array of pixel units 12 one to one, and each sensor 30 senses light emitted from a corresponding pixel unit 20.

In some embodiments, the sensor 30 is an optical sensor, or other optical sensing device capable of sensing the intensity of light emitted.

In some embodiments, a projection of the sensor 30 on the substrate 11 covers a projection of the corresponding pixel unit 20 on the substrate 11. Since the projection of the pixel unit 20 on the substrate 11 is within the projection of the corresponding sensor 30 on the substrate 11, the sensor 30 can sufficiently sense the light from the corresponding pixel unit 20.

As shown in FIG. 1, light emitted from the light emitting layer 22 passes through the anode layer 21 and the substrate 11, and passes through the cathode layer 23 to reach the array of sensors 13. Thereby, each sensor 30 in the array of sensors 13 is able to sense light emitted from the corresponding pixel unit 20.

In addition, as shown in FIG. 1, the display panel further includes a color filter layer 14 disposed on a second side of the substrate 11. The second side of the substrate 11 is away from the array of pixel units 12. The light emitted from the light emitting layer 22 reaches the color filter layer 14 through the anode layer 21 and the substrate 11 to display a corresponding color.

As shown in FIG. 1, the display panel further includes a pixel defining layer 15 and an encapsulation layer 16. The pixel defining layer 15 is used to define each pixel unit 20 in the array of pixel units 12. The encapsulation layer 16 is disposed on the side of the primary cathode layer 23 away from the light emitting layer 22 to encapsulate the pixel unit.

In the display panel provided by the above embodiment of the present disclosure, light can pass through the primary cathode layer of the pixel unit by adjusting the material of the primary cathode layer in the pixel unit. In this case, the array of sensors can be disposed on the non-light-emitting side of the OLED panel to compensate for the emission of the pixel unit by detecting the intensity of the transmitted light.

The display panel provided by the above embodiment can be used as a bottom emission device or a top emission device.

Figure 2:
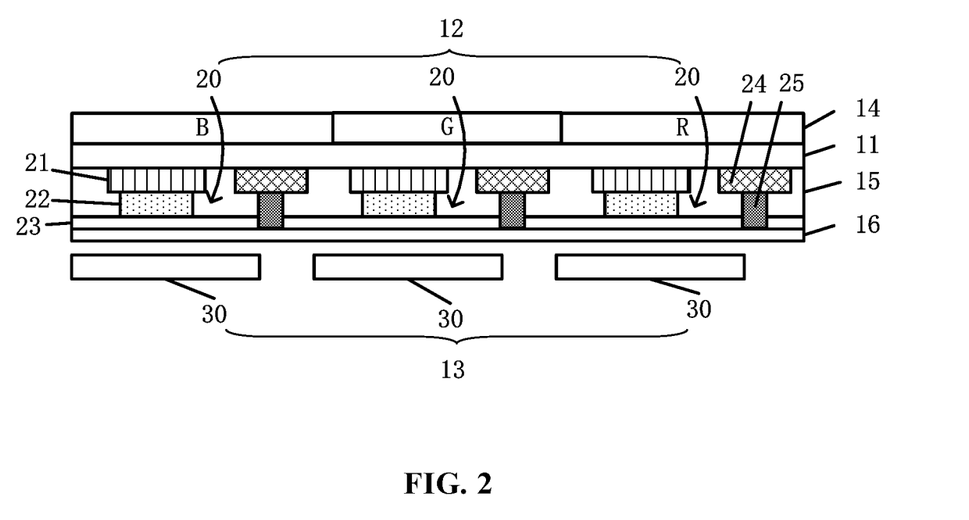
FIG. 2 is a schematic structural diagram of a display panel according to another embodiment of the present disclosure.

FIG. 2 is a schematic structural diagram of a display panel according to another embodiment of the present disclosure. FIG. 2 differs from FIG. 1 in that in the embodiment shown in FIG. 2, each of the at least some of the pixel units 20 further includes an auxiliary cathode 24 and a connector 25.

The connector 25 is provided in the pixel defining layer 15 to electrically connect the auxiliary cathode 24 with the primary cathode layer 23. The auxiliary cathode 24 is closer to the substrate 11 than the primary cathode layer 23 and the light-emitting layer 22.

By adding an auxiliary electrode electrically connected with the primary cathode layer, a sheet resistance of the cathode can be reduced, and the voltage drop (IR Drop) of the display panel can be reduced, so that the brightness uniformity of the OLED device is improved.

In some embodiments, the auxiliary cathode 24 is a conductive mesh, such as by making a layer of grid lines of conductive material on the substrate 11 to serve as the auxiliary cathode 24.

In some embodiments, the primary cathode layer 23 is perforated with a laser, and the connector 25 is formed between the primary cathode layer 23 and the auxiliary cathodes 24 by laser sintering.

Figure 3:
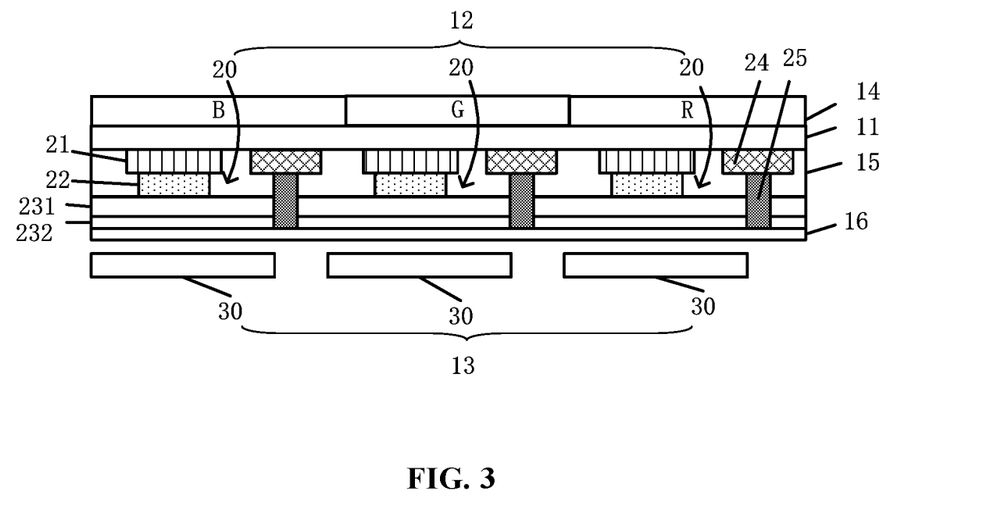
FIG. 3 is a schematic structural diagram of a display panel according to still another embodiment of the present disclosure.

FIG. 3 is a schematic structural diagram of a display panel according to still another embodiment of the present disclosure. FIG. 3 differs from FIG. 2 in that in the embodiment shown in FIG. 3, the primary cathode layer 23 includes a first cathode layer 231 and a second cathode layer 232.

As shown in FIG. 3, the first cathode layer 231 is disposed on a side of the light emitting layer 22 away from the anode layer 21. The second cathode layer 232 is disposed on a side of the first cathode layer 231 away from the light emitting layer 22. A thickness of the first cathode layer 231 is greater than a thickness of the second cathode layer 232.

It should be noted, the positions of the first cathode layer 231 and the second cathode layer 232 may be adjusted. For example, the second cathode layer 232 may be disposed on a side of the light emitting layer 22 away from the anode layer 21. The first cathode layer 231 is disposed on a side of the second cathode layer 232 away from the light emitting layer 22.

In some embodiments, the material of the first cathode layer 231 is indium zinc oxide, or other transparent conductive material. The thickness of the first cathode layer is not less than 2000 angstroms. The material of the second cathode layer 232 is magnesium silver alloy or other conductive material capable of transmitting light. The thickness of the second cathode layer is 300-500 angstroms.

In order to avoid the occurrence of the condition of poor contact between the primary cathode layer 23 and the connector 25, the primary cathode layer is designed as a composite structure. For example, the first cathode layer 231 is formed on the light emitting layer 22, and the second cathode layer 232 is formed on the first cathode layer 231. Since the material of the first cathode layer 231 is a transparent material, the light transmittance of is not affected. In addition, since the first cathode layer 231 has a large thickness, it can be in sufficient contact with the connector 25, thereby effectively avoiding the problem of poor contact between the primary cathode layer 23 and the connector 25.

The present disclosure also provides a display device, which may include a display panel as provided in any one of the embodiments of FIGS. 1-3. The display device can be any product or component with a display function, such as a display, a mobile phone, a tablet personal computer, a television, a notebook computer, a digital photo frame, a navigator and the like.

Figure 4:
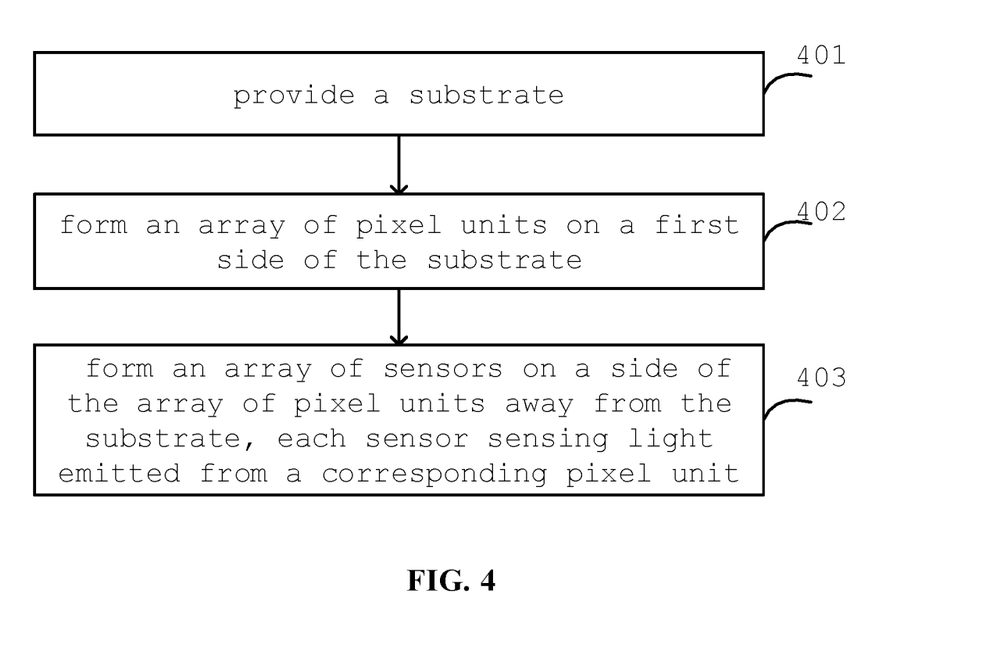
FIG. 4 is a schematic flow chart diagram of a method of manufacturing a display panel according to one embodiment of the present disclosure.

FIG. 4 is a schematic flow chart of a method of manufacturing a display panel according to one embodiment of the present disclosure.

In step 401, a substrate is provided.

At step 402, an array of pixel units is formed on a first side of a substrate. Each of at least some of the pixel units includes: a light emitting layer, an anode layer and a primary cathode layer disposed on two sides of the light emitting layer. The anode layer is closer to the substrate than the primary cathode layer. The primary cathode layer is light transmissive.

In some embodiments, the material of the primary cathode layer is a magnesium-silver alloy, or other electrically conductive material that is light-transmissive.

In some embodiments, the thickness of the primary cathode layer is 300 to 500 angstroms. For example, in the case where the thickness of the primary cathode layer is 500 angstroms, the light transmittance of the primary cathode layer may reach 80%.

In some embodiments, each of at least some of the pixel units further includes an auxiliary cathode and a connector. The connector is disposed in a pixel defining layer for defining the array of pixel units to electrically connect the auxiliary cathode with the primary cathode layer. The auxiliary cathode is closer to the substrate than the primary cathode layer and the light emitting layer.

By adding the auxiliary electrode electrically connected with the primary cathode layer, the square resistance of the cathode can be reduced, and the voltage Drop (IR Drop) of the display panel can be reduced, so that the brightness uniformity of the OLED device is improved.

In some embodiments, the auxiliary cathode is a conductive mesh. For example, by making a layer of grid lines of conductive material on the substrate to act as an auxiliary cathode.

In step 403, an array of sensors is formed on a side of the array of pixel units away from the substrate, and each sensor senses light emitted from a corresponding pixel unit.

In some embodiments, the sensor is an optical sensor, or other optical sensing device capable of sensing the intensity of light emitted.

In some embodiments, an encapsulation layer is formed on a side of the primary cathode layer away from the light emitting layer to encapsulate the pixel unit.

In some embodiments, a color filter layer is formed on the second side of the substrate. The second side of the substrate is away from the array of pixel units. The light passing through the color filter layer can display corresponding colors.

In the method for manufacturing a display panel according to the above embodiment of the present disclosure, light can pass through the primary cathode layer of the pixel unit by adjusting the material of the primary cathode layer in the pixel unit. In this case, the array of sensors can be placed on the non-light-emitting side of the OLED panel to compensate for the emission of the pixel unit by detecting the intensity of the transmitted light.

It should be noted that although the various method steps are shown in the figures in a certain order, this does not mean that the method steps must be performed in the order shown, but rather may be performed in an opposite or parallel order without departing from the spirit and principles of the present invention.

FIGS. 5A to 5J are cross-sectional views of structures at several stages in a display panel manufacturing method according to some embodiments of the present disclosure.

For simplicity, in the display panel shown in FIGS. 5A to 5I, only one pixel unit is given.

Figure 5A:
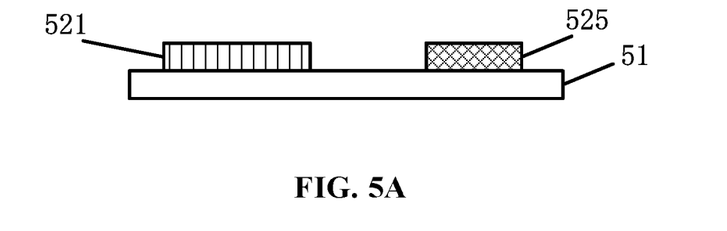
FIGS. 5A to 5J are cross-sectional views of structures at several stages of a display panel manufacturing method according to some embodiments of the present disclosure.

First, as shown in FIG. 5A, an anode layer 521 and an auxiliary cathode 525 are formed on a first side of a substrate 51.

In some embodiments, the auxiliary cathode 525 is a conductive mesh.

Figure 5B:
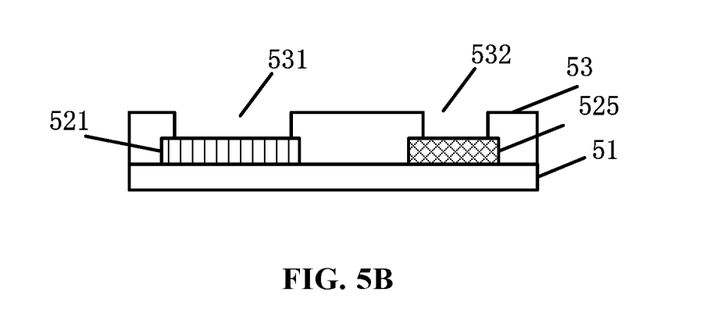

Next, as shown in FIG. 5B, a pixel defining layer 53 is formed on a first side of the substrate 51. The pixel defining layer 53 is provided with a first opening 531 exposing at least a portion of the anode layer 521, and a second opening 532 exposing at least a portion of the auxiliary cathode 525.

Figure 5C:
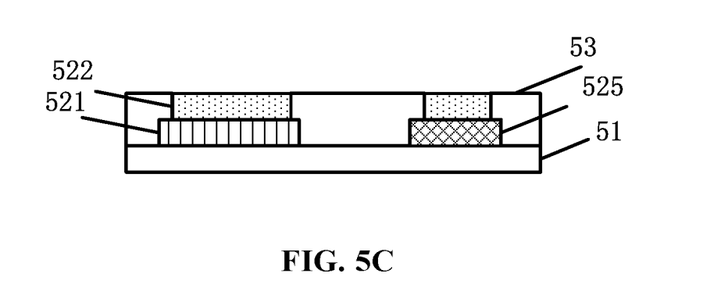

Next, as shown in FIG. 5C, the light emitting layer 522 is formed in the first opening 531 and the second opening 532.

Figure 5D:
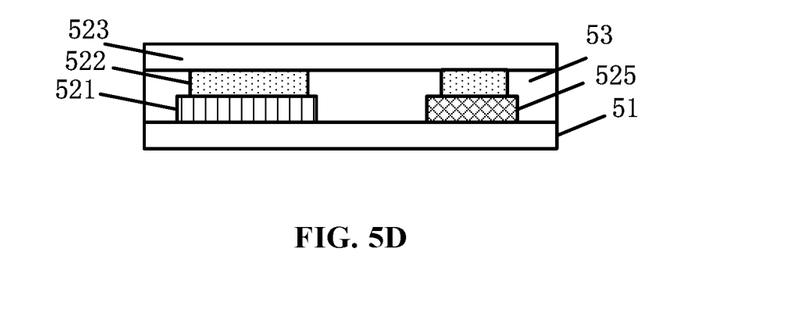

Next, as shown in FIG. 5D, a first cathode layer 523 is formed on the side of the light emitting layer 522 away from the anode layer 521.

In some embodiments, the material of the first cathode layer 523 is indium zinc oxide, or other transparent conductive material. The thickness of the first cathode layer 523 is not less than 2000 angstroms.

Figure 5E:
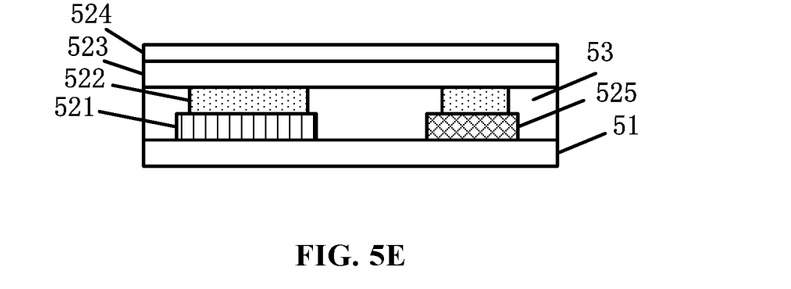

Next, as shown in FIG. 5E, a second cathode layer 524 is formed on a side of the first cathode layer 523 away from the light emitting layer 522. That is, the first cathode layer 523 and the second cathode layer 524 constitute a primary cathode layer having a composite structure.

In some embodiments, the material of the second cathode layer 524 is a magnesium-silver alloy, or other conductive material that is transparent to light. The thickness of the second cathode layer 524 is 300-500 angstroms.

The material of the first cathode layer is transparent material, so that the light transmittance is not influenced. In addition, the thickness of the first cathode layer is large, so that the first cathode layer can be fully contacted with the connector, and the problem of poor contact between the primary cathode layer and the connector is effectively avoided.

It should be noted that in the primary cathode layer, the order of the first cathode layer 523 and the second cathode layer 524 may be adjusted. For example, the second cathode layer 524 may be formed on a side of the light emitting layer 522 away from the anode layer 521, and the first cathode layer 523 may be formed on a side of the second cathode layer 524 away from the light emitting layer 522.

Figure 5F:
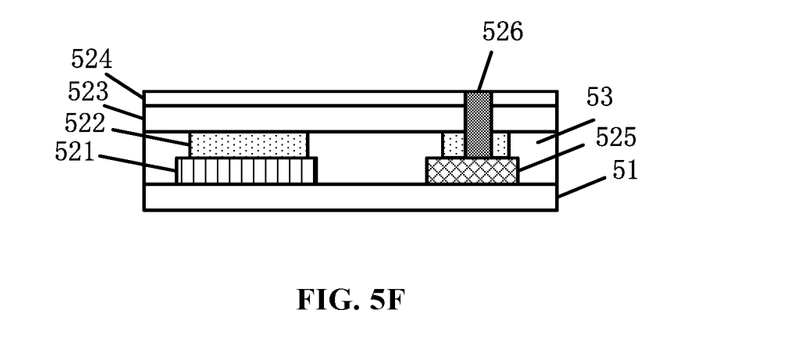

Next, as shown in FIG. 5F, the first cathode layer 523 and the second cathode layer 524 are perforated to form a connector 526 between the primary cathode layer and the auxiliary cathode 525, so that the first cathode layer 523 and the second cathode layer 524 in the primary cathode layer are electrically connected to the auxiliary cathode 525.

It should be noted that in the laser perforation process, an connector is formed between the primary cathode layer and the auxiliary cathode layer by laser sintering.

Figure 5G:
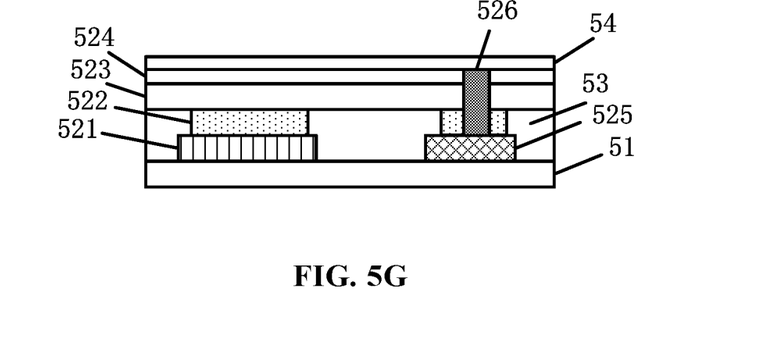

Next, as shown in FIG. 5G, the encapsulation layer 54 is formed on the side of the second cathode layer 524 away from the first cathode layer 523.

Figure 5H:
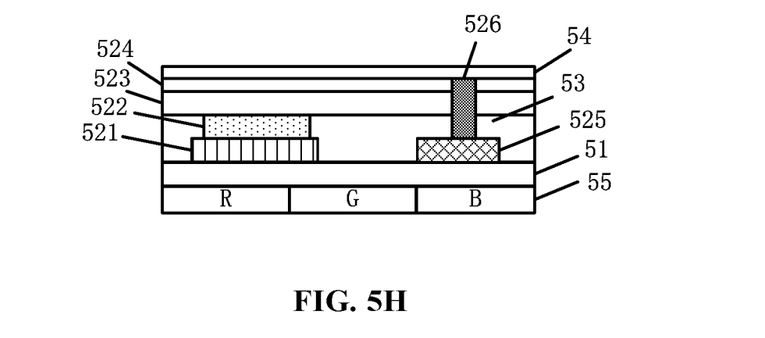

Next, as shown in FIG. 5H, a color filter layer 55 is formed on a second side of the substrate 51 away from the anode layer 521.

Figure 5I:
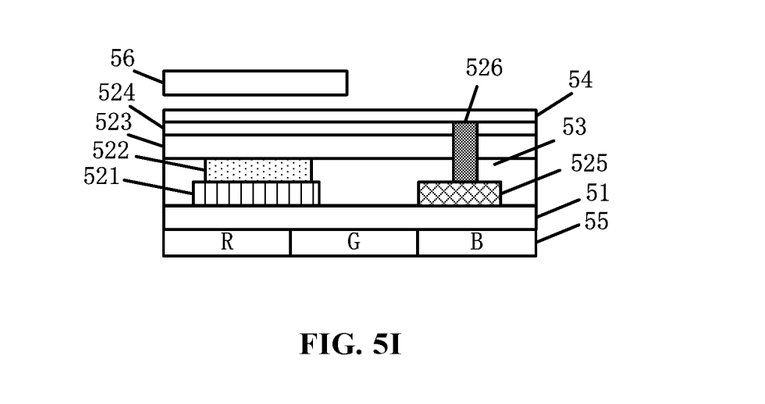

Next, as shown in FIG. 5I, the sensor 56 is disposed on a side of the encapsulation layer 54 away from the second cathode layer 524.

In some embodiments, the sensor is an optical sensor, or other optical sensing device capable of sensing the brightness of light.

The present disclosure enables light to pass through the primary cathode layer of a pixel unit by adjusting the primary cathode layer material in the pixel unit. In this case, the array of sensors can be placed on the non-light-emitting side of the OLED panel to compensate for the emission of the pixel unit by detecting the intensity of the transmitted light.

Figure 5J:
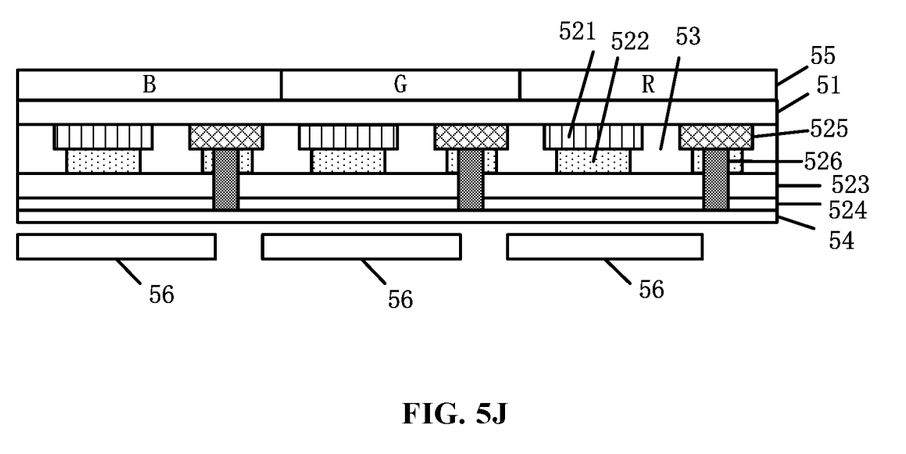

Only one pixel unit is shown in the display panel shown in FIGS. 5A to 5I. In practice, the display panel includes a plurality of pixel units, and the corresponding schematic diagram is shown in FIG. 5J.

So far, embodiments of the present disclosure have been described in detail. Some details that are well known in the art have not been described in order to avoid obscuring the concepts of the present disclosure. It will be fully apparent to those skilled in the art from the foregoing description how to practice the presently disclosed embodiments. Although some specific embodiments of the present disclosure have been described in detail by way of example, it should be understood by those skilled in the art that the foregoing examples are for purposes of illustration only and are not intended to limit the scope of the present disclosure. It will be understood by those skilled in the art that various changes may be made in the above embodiments or equivalents may be substituted for elements thereof without departing from the scope and spirit of the present disclosure. The scope of the present disclosure is defined by the appended claims.

What is claimed is:

1. A display panel, comprising:
   a substrate;
   an array of pixel units disposed on a first side of the substrate, wherein each of at least some pixel units of the array of pixel units comprises: a light emitting layer, an anode layer, and a primary cathode layer which is light transmissive disposed on two sides of the light emitting layer, the anode layer being closer to the substrate than the primary cathode layer;
   an array of sensors disposed on one side of the array of pixel units, which is far away from the substrate, each sensor sensing the light emitted from a corresponding pixel unit; and
   a pixel defining layer for defining the array of pixel units, wherein each of the at least some pixel units further comprises an auxiliary cathode and a connector, the connector is disposed in the pixel defining layer to electrically connect the auxiliary cathode with the primary cathode layer, the auxiliary cathode being closer to the substrate that the primary cathode layer.

2. The display panel of claim 1, wherein the auxiliary cathode is a conductive mesh.

3. The display panel according to claim 1, wherein the primary cathode layer comprises a first cathode layer and a second cathode layer, a thickness of the first cathode layer is greater than a thickness of the second cathode layer.

4. The display panel of claim 3, wherein
a material of the first cathode layer is indium zinc oxide; and
a material of the second cathode layer is magnesium-silver alloy.

5. The display panel of claim 4, wherein
the thickness of the first cathode layer is not less than 2000 angstroms; and
the thickness of the second cathode layer is 300 to 500 angstroms.

6. The display panel of claim 1, further comprising:
a packaging layer disposed on one side of the primary cathode layer, which is far away from the light emitting layer.

7. The display panel of claim 1, further comprising:
a color filter layer disposed on a second side of the substrate, the second side of the substrate being far away from the array of pixel units.

8. The display panel of claim 1, wherein
a projection of the sensor on the substrate covers a projection of a corresponding pixel unit on the substrate.

9. The display panel of claim 1, wherein
sensors in the array of sensors correspond to pixel units in the array of pixel units one to one.

10. A display device, comprising a display panel, the display panel comprises:
a substrate;
an array of pixel units disposed on a first side of the substrate, wherein each of at least some pixel units of the array of pixel units comprises: a light emitting layer, an anode layer and a primary cathode layer which is light transmissive disposed on two sides of the light emitting layer, the anode layer being closer to the substrate than the primary cathode layer;
an array of sensors disposed on one side of the array of pixel units, which is far away from the substrate, each sensor sensing the light emitted from a corresponding pixel unit; and
a pixel defining layer for defining the array of pixel units, wherein each of the at least some pixel units further comprises an auxiliary cathode and a connector, the connector is disposed in the pixel defining layer to electrically connect the auxiliary cathode with the primary cathode layer, the auxiliary cathode being closer to the substrate than the primary cathode layer.

11. A method of manufacturing a display panel, comprising:
providing a substrate;
forming an array of pixel units on a first side of a substrate, wherein each of at least some pixel units of the array of pixel units comprises: a light emitting layer, an anode layer, and a primary cathode layer which is light transmissive disposed on two sides of the light emitting layer, the anode layer being closer to the substrate than the primary cathode layer, each of the at least some pixel units further comprises an auxiliary cathode and a connector, the connector is disposed in a pixel defining layer defining the array of pixel units to electrically connect the auxiliary cathode with the primary cathode layer, the auxiliary cathode being closer to the substrate than the primary cathode layer; and
forming an array of sensors on one side of the array of pixel units, which is far away from the substrate, wherein each sensor senses light emitted from a corresponding pixel unit.

12. The manufacturing method of claim 11, wherein forming each of the at least some pixel units comprises:
forming an anode layer and an auxiliary cathode on the first side of the substrate;
forming a pixel defining layer on the first side of the substrate, the pixel defining layer being provided with a first opening exposing at least a portion of the anode layer and a second opening exposing at least a portion of the auxiliary cathode;
forming a light emitting layer in the first opening and the second opening;
forming a primary cathode layer on one side of the light emitting layer far away from the anode layer; and
perforating the primary cathode layer to form a connector between the primary cathode layer and the auxiliary cathode, to electrically connect the primary cathode layer with the auxiliary cathode.

13. The manufacturing method of claim 11, wherein
the primary cathode layer comprises a first cathode layer and a second cathode layer, a thickness of the first cathode layer is greater than a thickness of the second cathode layer.

14. The manufacturing method according to claim 13, wherein
a material of the first cathode layer is indium zinc oxide; and
a material of the second cathode layer is magnesium-silver alloy.

15. The manufacturing method according to claim 14, wherein
the thickness of the first cathode layer is not less than 2000 angstroms; and
the thickness of the second cathode layer is 300 to 500 angstroms.

16. The manufacturing method according to claim 11, further comprising:
forming an encapsulation layer on one side of the primary cathode layer far away from the light emitting layer.

17. The manufacturing method according to claim 11, further comprising:
forming a color filter layer on the second side of the substrate, wherein the second side of the substrate is far away from the array of pixel units.

\* \* \* \* \*

UNITED STATES PATENT AND TRADEMARK OFFICE
CERTIFICATE OF CORRECTION

PATENT NO. : 11,251,172 B2
APPLICATION NO. : 16/630417
DATED : February 15, 2022
INVENTOR(S) : Haisheng Wang et al.

It is certified that error appears in the above-identified patent and that said Letters Patent is hereby corrected as shown below:

On the Title Page

Item [22], delete "15," and insert -- 25, --

Signed and Sealed this
Twelfth Day of July, 2022

Katherine Kelly Vidal
*Director of the United States Patent and Trademark Office*